US008866179B2

(12) United States Patent
Sugizaki et al.

(10) Patent No.: US 8,866,179 B2
(45) Date of Patent: Oct. 21, 2014

(54) SEMICONDUCTOR LIGHT EMITTING DEVICE AND METHOD FOR MANUFACTURING SAME

(75) Inventors: Yoshiaki Sugizaki, Kanagawa-ken (JP); Susumu Obata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/881,428

(22) Filed: Sep. 14, 2010

(65) Prior Publication Data

US 2011/0291148 A1 Dec. 1, 2011

(30) Foreign Application Priority Data

May 26, 2010 (JP) .................................. 2010-120262

(51) Int. Cl.
| | |
|---|---|
| *H01L 33/44* | (2010.01) |
| *H01L 33/62* | (2010.01) |
| *H01L 33/48* | (2010.01) |
| H01L 33/00 | (2010.01) |
| H05K 3/34 | (2006.01) |
| H01L 33/54 | (2010.01) |

(52) U.S. Cl.
CPC ........... *H01L 33/486* (2013.01); *H01L 33/0079* (2013.01); *H05K 2201/10106* (2013.01); *H01L 33/44* (2013.01); *H05K 3/3436* (2013.01); *H01L 33/62* (2013.01); *H01L 33/54* (2013.01); *H01L 2224/16* (2013.01)
USPC ................. 257/99; 257/E33.06; 257/E33.066

(58) Field of Classification Search
CPC ..... H01L 33/60; H01L 33/0095; H01L 33/44; H01L 33/62
USPC .......................................... 257/98, 99, E33.06
See application file for complete search history.

(56) References Cited

U.S. PATENT DOCUMENTS

| | | | |
|---|---|---|---|
| 5,928,567 A | 7/1999 | Flottman et al. | |
| 6,331,450 B1 | 12/2001 | Uemura | |
| 6,649,941 B2 | 11/2003 | Uemura | |
| 2002/0134579 A1 | 9/2002 | Saito | |
| 2005/0194605 A1* | 9/2005 | Shelton et al. ................. | 257/99 |
| 2006/0159898 A1 | 7/2006 | Uchiyama et al. | |
| 2006/0163604 A1 | 7/2006 | Shin et al. | |
| 2007/0030611 A1 | 2/2007 | Cho et al. | |

(Continued)

FOREIGN PATENT DOCUMENTS

| | | |
|---|---|---|
| DE | 100 44 500 A1 | 4/2002 |
| DE | 10 2005 043 649 A1 | 4/2006 |

(Continued)

OTHER PUBLICATIONS

Extended European Search Report for European Patent Application No. 10177314.1 mailed on Dec. 22, 2010.

(Continued)

*Primary Examiner* — Yu Chen
(74) *Attorney, Agent, or Firm* — White & Case LLP

(57) ABSTRACT

According to one embodiment, a semiconductor light emitting device includes a semiconductor layer, a first electrode, a second electrode, an insulating layer, a first interconnection layer, a second interconnection layer, a first metal pillar, a second metal pillar, a resin layer and a conductive material. The conductive material is provided on a surface of the resin layer between the first metal pillar and the second metal pillar, and electrically connects the first metal pillar and the second metal pillar.

10 Claims, 18 Drawing Sheets

(56) References Cited

U.S. PATENT DOCUMENTS

| | | |
|---|---|---|
| 2008/0105885 A1 | 5/2008 | Watanabe et al. |
| 2009/0194779 A1 | 8/2009 | Yoon |
| 2010/0127292 A1* | 5/2010 | Wang et al. .................. 257/98 |
| 2010/0148198 A1 | 6/2010 | Sugizaki et al. |
| 2010/0237382 A1* | 9/2010 | Kamei ......................... 257/99 |

FOREIGN PATENT DOCUMENTS

| | | |
|---|---|---|
| EP | 0 921 577 A1 | 6/1999 |
| JP | 2000-244012 A | 9/2000 |
| JP | 2009-152637 A | 7/2009 |
| WO | 2008/154573 A1 | 12/2008 |
| WO | WO 2009054088 A1 * | 4/2009 |

OTHER PUBLICATIONS

European Examination Report for European Patent Application No. 10177314.1 issued on Jun. 5, 2012.

TW Office Action issued in counterpart TW Application No. 099129913 on Jul. 31, 2013, an English translation thereof.

TW Office Action received in corresponding TW Application No. 099129913 dated Nov. 27, 2013, and an English translation thereof.

* cited by examiner

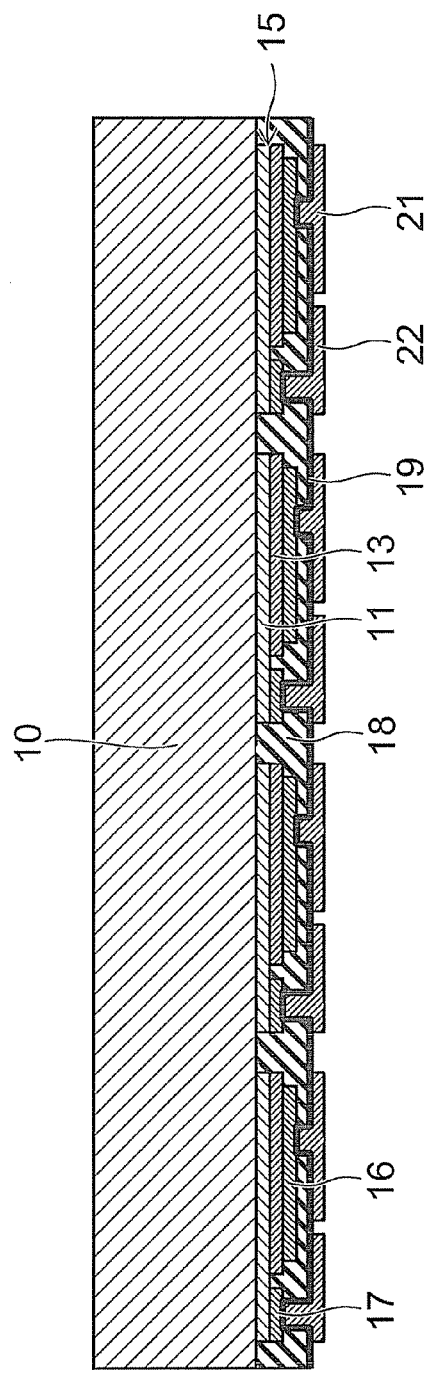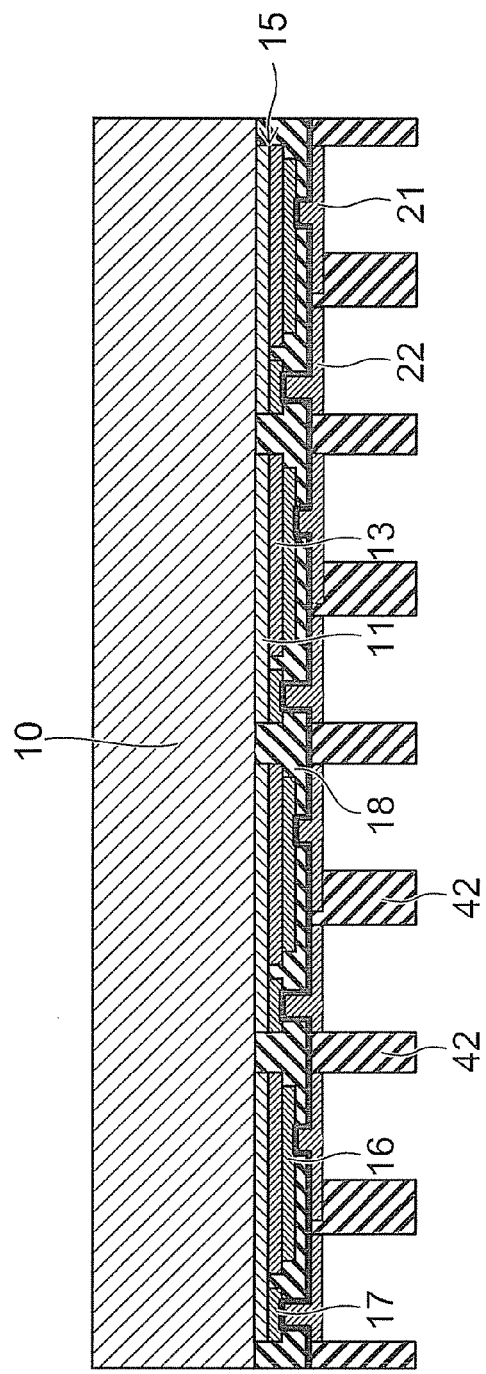

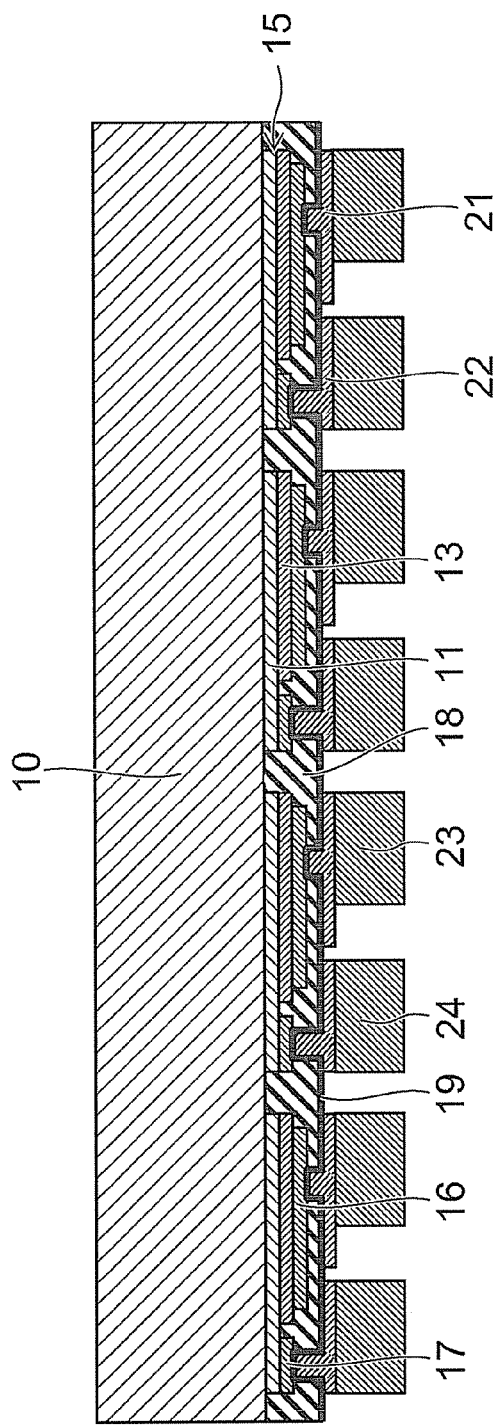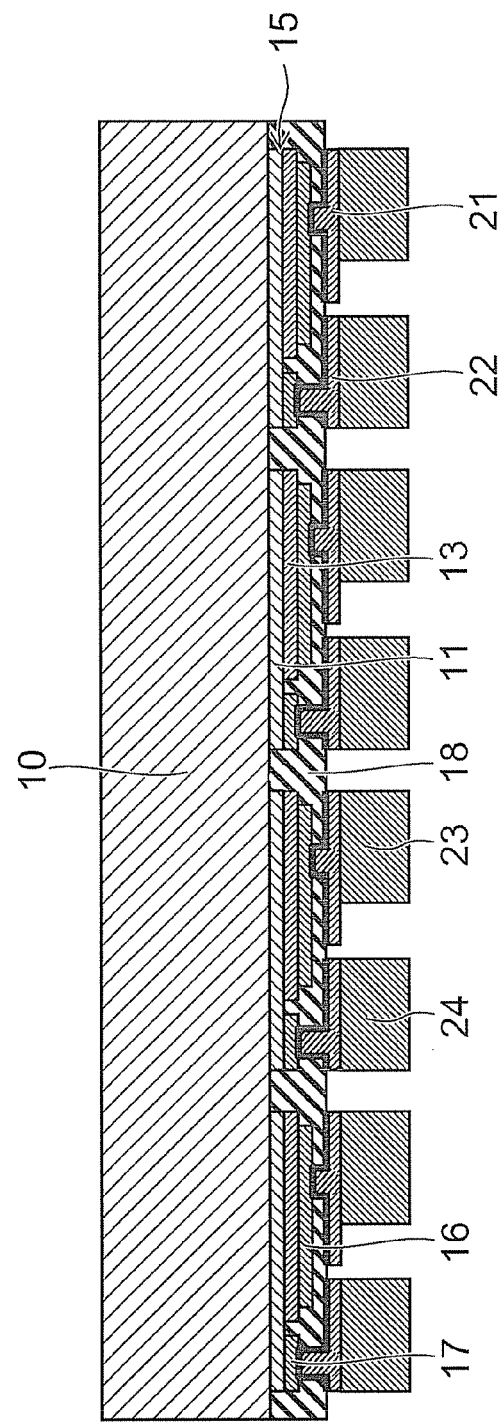

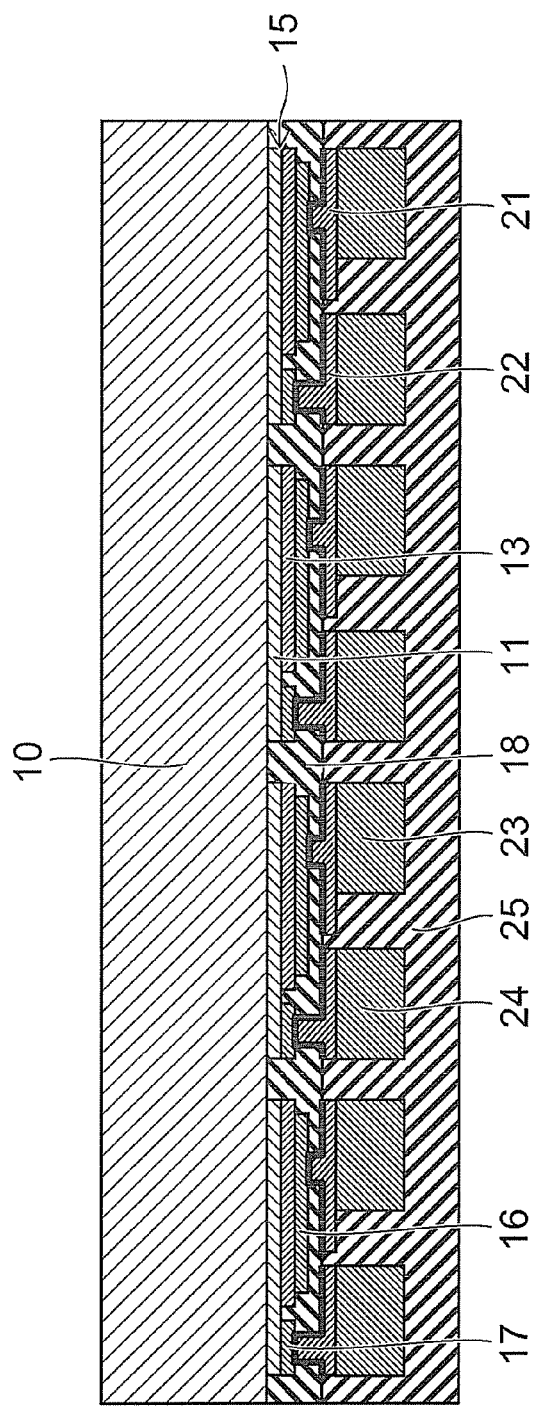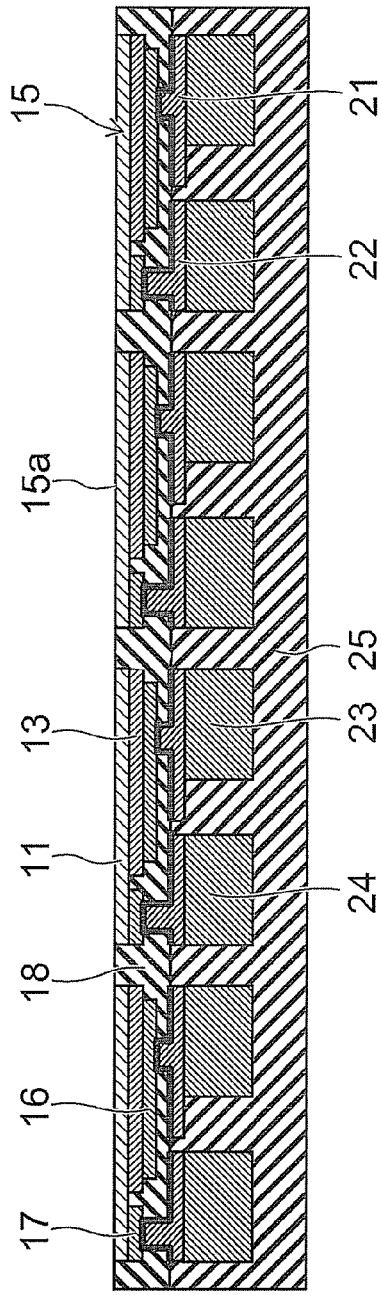

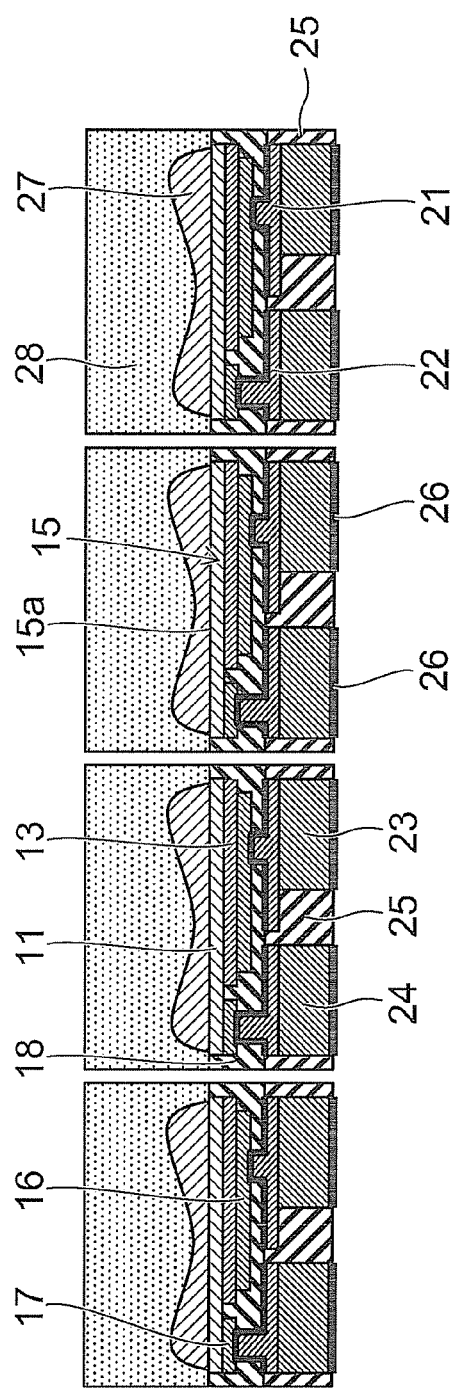
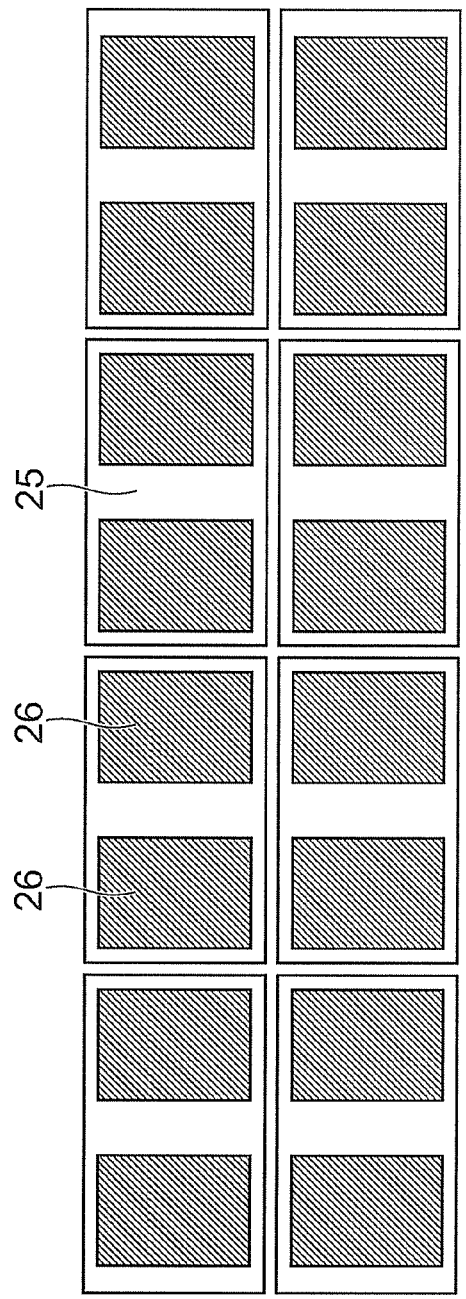
FIG. 13A
FIG. 13B

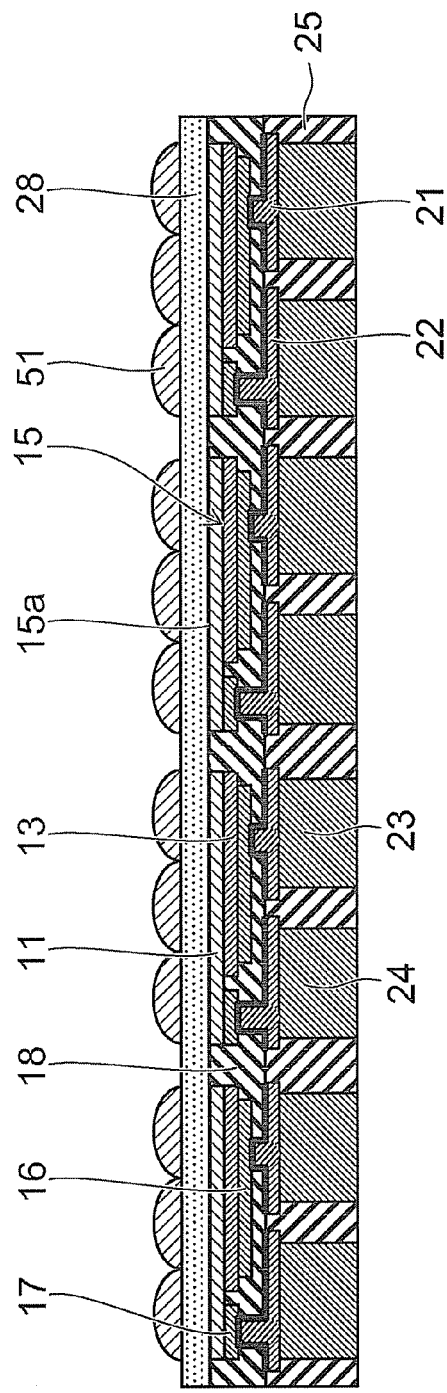
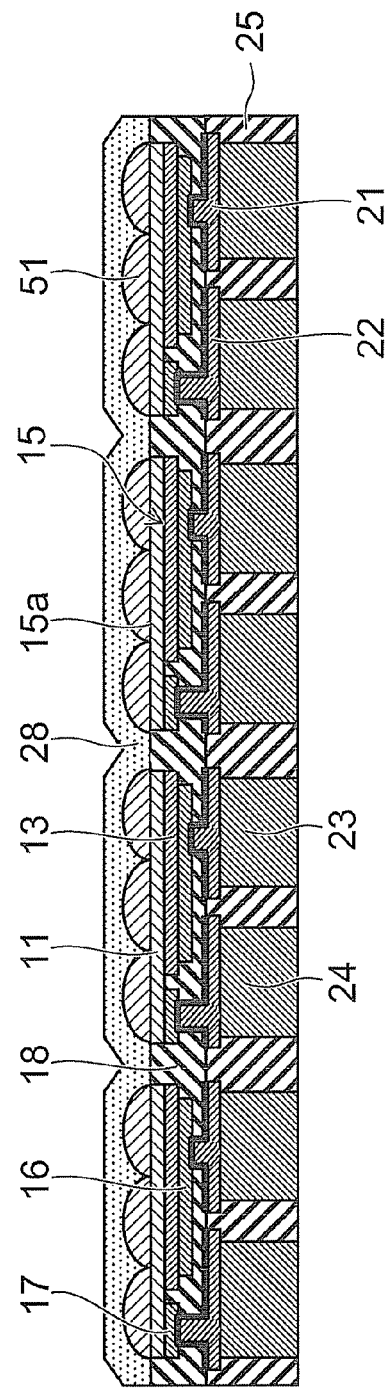
FIG. 17A
FIG. 17B

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2010-120262, filed on May 26, 2010; the entire contents of which are incorporated herein by reference.

FIELD

Embodiments described herein relate generally to a semiconductor light emitting device and a method for manufacturing the same.

BACKGROUND

A technique is known in which a light emitting diode (LED) chip is flip-chip bonded to a mount board, the LED chip including an n-side electrode and a p-side electrode formed on a main surface side of a semiconductor layer. A flip chip structure is required to achieve reduction in chip size and still maintain its reliability.

BRIEF DESCRIPTION OF THE DRAWINGS

FIGS. 3A to 14 are schematic views showing a method for manufacturing the semiconductor light emitting device of the first embodiment;

FIGS. 17A and 17B are schematic views showing a variation of a lens and a phosphor layer.

DETAILED DESCRIPTION OF THE INVENTION

Figure 1:
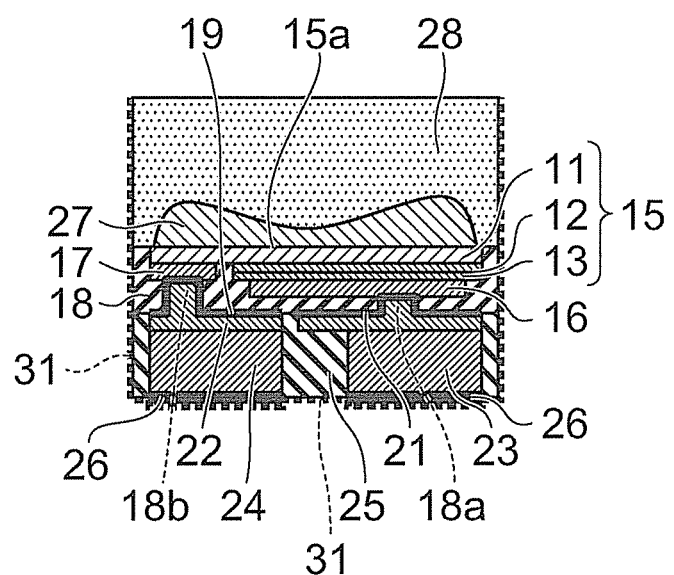
FIG. 1 is a schematic cross-sectional view of a semiconductor light emitting device of a first embodiment.

According to one embodiment, a semiconductor light emitting device includes a semiconductor layer, a first electrode, a second electrode, an insulating layer, a first interconnection layer, a second interconnection layer, a first metal pillar, a second metal pillar, a resin layer and a conductive material. The semiconductor layer includes a first main surface, a second main surface opposite side to the first main surface, and a light emitting layer. The first electrode is provided on the second main surface in a region where the light emitting layer is provided. The second electrode is provided on the second main surface. The insulating layer is provided on the second main surface side of the semiconductor layer and includes a first opening that reaches the first electrode and a second opening that reaches the second electrode. The first interconnection layer is provided on a surface of the insulating layer opposite to a surface facing the semiconductor layer and provided in the first opening. The first interconnection layer is connected to the first electrode. The second interconnection layer is provided on a surface of the insulating layer opposite to a surface facing the semiconductor layer and provided in the second opening. The second interconnection layer is connected to the second electrode. The first metal pillar is provided on a surface of the first interconnection layer opposite to a surface facing the first electrode. The second metal pillar is provided on a surface of the second interconnection layer opposite to a surface facing the second electrode. The resin layer is provided between a side surface of the first metal pillar and a side surface of the second metal pillar. The conductive material is provided on a surface of the resin layer between the first metal pillar and the second metal pillar, and electrically connects the first metal pillar and the second metal pillar.

Hereinbelow, embodiments are described with reference to the drawings. Note that the same component is assigned the same reference numeral in the drawings, and the drawing indicating a process show a partial region of a wafer.

(First Embodiment)

FIG. 1 is a schematic cross-sectional view of a semiconductor light emitting device of a first embodiment.

The semiconductor light emitting device of this embodiment has a structure in which electrodes and interconnections are provided on a main surface (second main surface lower side in FIG. 1) side of a semiconductor layer 15. Light is mainly extracted from a first main surface 15a on the opposite side to the second main surface.

The semiconductor layer 15 includes a first semiconductor layer 11 and a second semiconductor layer 13. The first semiconductor layer 11 is an n-type GaN layer, for example, and functions as a transverse passage for a current. Note that the conductivity type of the first semiconductor layer 11 is not limited to the n-type, and may be a p-type. The second semiconductor layer 13 has a stacked structure in which a light emitting layer (active layer) 12 is interposed between an n-type layer and a p-type layer.

The second main surface side of the semiconductor layer 15 is processed into a stepped form, and an upper part and a lower part are provided on the second main surface side of the semiconductor layer 15. The upper part which is positioned above the lower part as seen from the first main surface 15a includes the light emitting layer 12. The lower part does not include the light emitting layer 12, and is provided outside the outer circumference (edge) of the light emitting layer 12.

A p-side electrode 16 is provided as a first electrode on a surface of the second semiconductor layer 13, which is a surface of the upper part. In other words, the p-side electrode 16 is provided in a region where the light emitting layer 12 is provided. An n-side electrode 17 is provided as a second electrode on a surface of the first semiconductor layer 11 in the lower part.

Figure 3A:
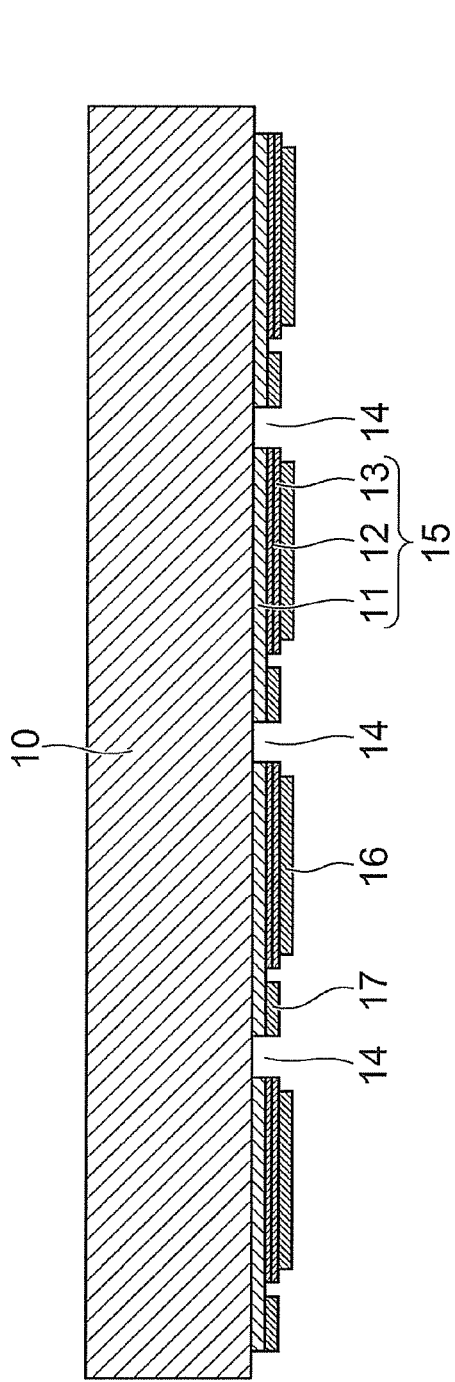
Figure 3B:
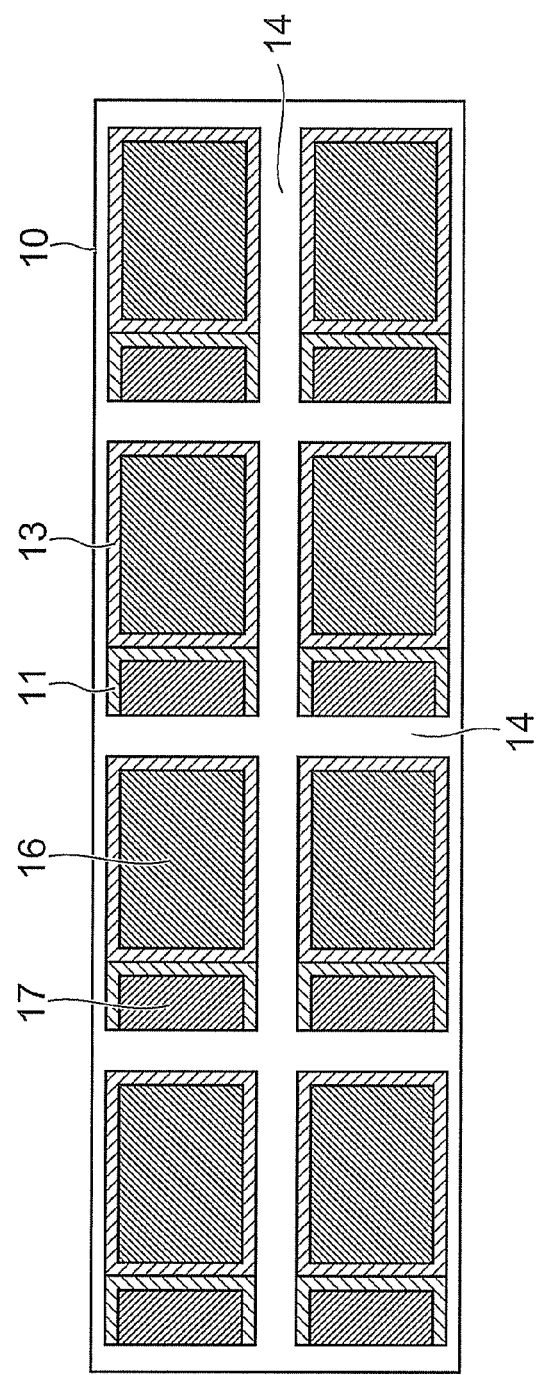

FIG. 3B shows an example of a planar layout of the p-side electrode 16 and the n-side electrode 17. An area of the p-side electrode 16 is larger than an area of the n-side electrode 17 in a single semiconductor layer 15. Accordingly, a broad light emitting region can be obtained.

The second main surface side of the semiconductor layer 15 is covered with an insulating layer 18. Edges (side surfaces) of the semiconductor layer 15 are also covered with the insulating layer 18. The insulating layer 18 is, for example, resin such as polyimide having excellent patterning property in forming fine openings. Alternatively, silicone oxide may be used as the insulating layer 18.

In the insulating layer 18, a surface opposite to a surface facing the semiconductor layer 15 is planarized, and a p-side interconnection layer 21 as a first interconnection layer and an n-type interconnection layer 22 as a second interconnection layer are provided thereon. The p-side interconnection layer 21 is also provided inside a first opening 18a formed in the insulating layer 18 to reach the p-side electrode 16, and is connected to the p-side electrode 16. The n-side interconnection layer 22 is also provided inside a second opening 18b formed in the insulating layer 18 to reach the n-side electrode 17, and is connected to the n-side electrode 17.

On a surface of the p-side interconnection layer 21 opposite to a surface facing the p-side electrode 16, a p-side metal pillar 23 is provided as a first metal pillar. On a surface of the n-side interconnection layer 22 opposite to a surface facing the n-side electrode 17, an n-side metal pillar 24 is provided as a second metal pillar.

The circumference of the p-side metal pillar 23, the circumference of the n-side metal pillar 24, the p-side interconnection layer 21 and the n-side interconnection layer 22 are covered with a resin layer 25. The resin layer 25 is filled between the p-side metal pillar 23 and the n-side metal pillar 24 for reinforcement of the pillars. Bottom surfaces of the p-side metal pillar 23 and the n-side metal pillar 24 are exposed from the resin layer 25.

The contact area between the n-side interconnection layer 22 and the n-side metal pillar 24 is larger than the contact area between the n-side interconnection layer 22 and the n-side electrode 17. Meanwhile, the contact area between the p-side interconnection layer 21 and the p-side metal pillar 23 is larger than the contact area between the p-side interconnection layer 21 and the p-side electrode 16. Alternatively, the contact area between the p-side interconnection layer 21 and the p-side metal pillar 23 may be smaller than the contact area between the p-side interconnection layer 21 and the p-side electrode 16.

In other words, the surface area of the n-side interconnection layer 22 is larger on the opposite side to the n-side electrode 17 than that on the n-side electrode 17 side. The n-side interconnection layer 22 is connected to the n-side electrode 17 which is provided in the semiconductor layer 15 where the light emitting layer 12 is not provided. In addition, a part of the n-side interconnection layer 22 is extended on the insulating layer 18 to a position under the light emitting layer 12.

Accordingly, a high optical output by a broader light emitting layer 12 is maintained while a broader extraction electrode can be formed, via the n-side interconnection layer 22, from the n-side electrode 17 provided in a narrow area in the semiconductor layer 15 where the light emitting layer 12 is not provided.

The first semiconductor layer 11 is electrically connected to the n-side metal pillar 24 via the n-side electrode 17 and the n-side interconnection layer 22. The second semiconductor layer 13 is electrically connected to the p-side metal pillar 23 via the p-side electrode 16 and the p-side interconnection layer 21.

A top coat film 26 is formed for prevention of rust and the like on a surface (bottom surface in FIG. 1) of the p-side metal pillar 23. The top coat film 26 is similarly formed on the bottom surface of the n-side metal pillar 24. Examples of the top coat film 26 include precoated solder and an electroless plating film of Ni or Au.

Exemplar materials of the n-side interconnection layer 22, the p-side interconnection layer 21, the n-side metal pillar 24 and the p-side metal pillar 23 include copper, gold, nickel and silver. Among these materials, copper is preferable, which has favorable thermal conductivity, high migration resistance and excellent adhesion on an insulating material.

As the resin layer 25 for reinforcement of the n-side metal pillar 24 and the p-side metal pillar 23, a material having the same or similar coefficient of thermal expansion as a mount board is desirably used. For example, epoxy resin, silicone resin and fluororesin may be used as examples of the resin layer 25.

A lens 27 and a phosphor layer 28 are provided on the first main surface 15a of the semiconductor layer 15. The phosphor layer 28 is capable of absorbing light emitted from the light emitting layer 12 and thereby emitting a wavelength-converted light. Accordingly, it is possible to emit a mixed light beam including light emitted from the light emitting layer 12 and wavelength-converted light emitted from the phosphor layer 28. For example, in the case of a nitride based light emitting layer 12, white, warm white or the like can be obtained as a mixture of blue light from the light emitting layer 12 and yellow light being a wavelength-converted light emitted from a yellow phosphor layer 28, for example. Note that the phosphor layer 28 may be configured to include multiple kinds of phosphors (such as a red phosphor and a green phosphor).

Light emitted from the light emitting layer 12 mainly passes through the first semiconductor layer 11, the first main surface 15a, the lens 27 and the phosphor layer 28 to be emitted to the outside.

A conducting polymer film 31 is formed as a conductive material on the entire mounting surface (bottom surface in FIG. 1) including surfaces of the resin layer 25, the p-side metal pillar 23 and the n-side metal pillar 24. The conducting polymer film 31 electrically connects and short-circuits the p-side metal pillar 23 and the n-side metal pillar 24 on the mounting surface side.

The semiconductor light emitting device in FIG. 1 is cut out from a wafer, and the conducting polymer film 31 is formed also on side surfaces (left and right surfaces in FIG. 1) of the cut-out semiconductor light emitting device. Polythiophene or polypyrrole may be used as the conducting polymer, for example. Note that the conducting polymer film 31 is at least formed on the mounting surface side where the p-side metal pillar 23 and the n-side metal pillar 24 are short-circuited.

Figure 2A:
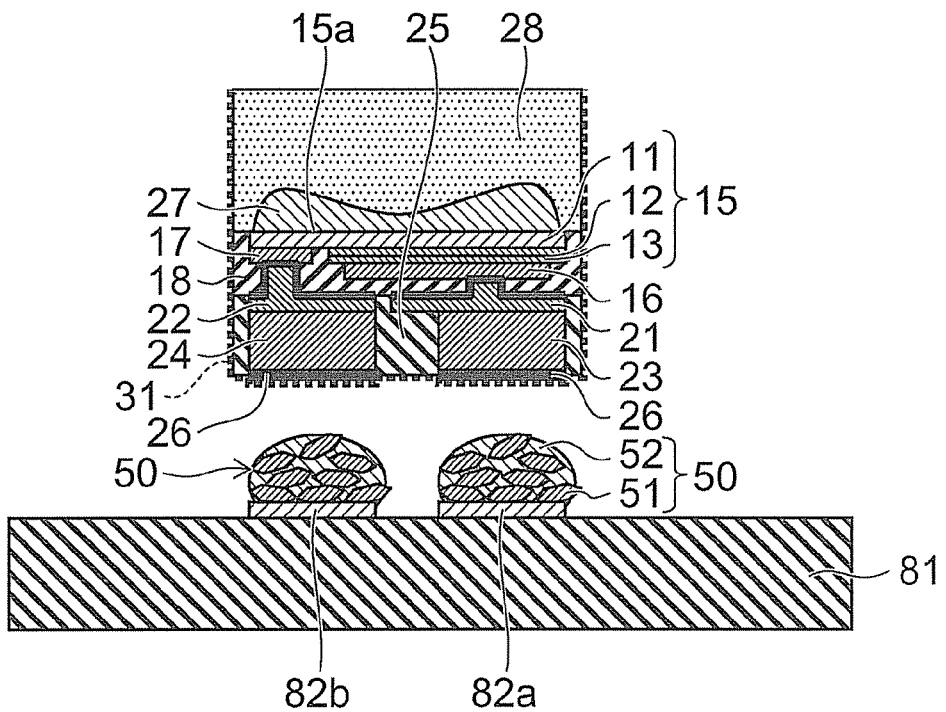
FIGS. 2A and 2B are schematic cross-sectional views showing the mounting of the semiconductor light emitting device of the first embodiment to a mount board.

FIG. 1 shows a state of the semiconductor light emitting device before it is mounted on a mount board. As shown in FIG. 2A, this device is mounted on a mount board 81 with a solder paste 50 interposed therebetween. The solder paste 50 includes particulate solder 51 and flux 52. The solder 51 contains stannum (Sn), silver (Ag), bismuth (Bi), copper (Cu) and the like, for example. The solder 51 is dispersed in the liquid flux 52. The flux 52 contains resin, an activator and the like, and assists bonding of the solder by removing an oxide film from a bonding surface at the reflow soldering.

The top coat film 26 is formed on the bonding surface of the semiconductor light emitting device side. Otherwise, the p-side metal pillar 23 and the n-side metal pillar 24 may be bonded directly to pads 82a and 82b without providing the top coat film 26.

Figure 2B:
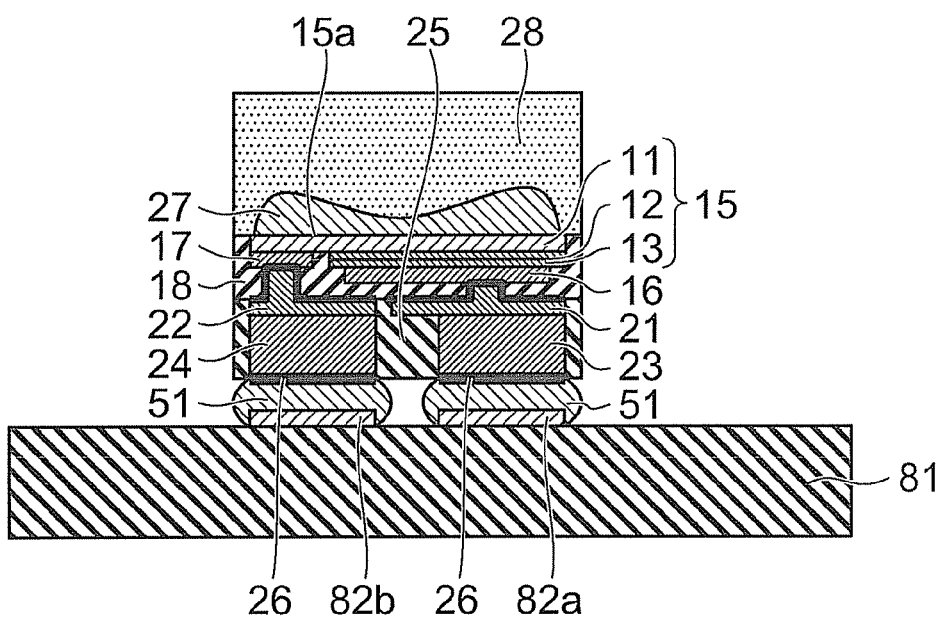

The semiconductor light emitting device is mounted on the mount board 81 by interposing the solder paste 50 between the pads 82a, 82b formed on the mount board 81 and the bonding surface on the semiconductor light emitting device side. In this state, reflow soldering is carried out to melt the solder 51. Thus, as shown in FIG. 2B, the top coat film 26 formed on the bottom surfaces of the p-side metal pillar 23 and the n-side metal pillar 24 is bonded to the pads 82a and 82b with the solder 51 interposed therebetween.

This mounting process includes processes of picking up the semiconductor light emitting device by a tool, holding the device, and mounting the device on the mount board 81. At this time, since the conducting polymer film 31 that short-circuits the p-side metal pillar 23 and the n-side metal pillar 24 is formed on the mounting surface side of the semiconductor light emitting device, the inside of the light emitting device can be protected from electro static discharge (ESD). Specifically, a leak path for an ESD surge is formed on a surface of the device, so that the ESD surge does not flow inside the device. Thus, the semiconductor light emitting device can be prevented from being broken by ESD.

At the mounting, the conducting polymer film 31 is dissolved with the flux 52. For example, in a case where the conducting polymer is polythiophene, it is dissolved with water soluble flux. After the conducting polymer film 31 is dissolved with the flux 52, the bonding surface (top coat film 26) of the semiconductor light emitting device is exposed, and the solder 51 is bonded to the bonding surface.

After the mounting, cleaning is carried out by use of water or an organic solvent to remove the flux 52. At this time, by using a kind of conducting polymer film 31 that is soluble to the cleaning solution, the conducting polymer film 31 is also cleaned and removed. Thus, after the mounting and cleaning, the leak path that short-circuits the p-side metal pillar 23 and the n-side metal pillar 24 is removed.

Since the conducting polymer film 31 is dissolved with the flux 52 at the mounting, the conducting polymer film 31 may be formed on the entire bottom surface of the device, including the bonding surface. Otherwise, a part of the bonding surface may be exposed by patterning the conducting polymer film 31.

Since this embodiment does not require a protection device such as a zener diode embedded inside the package for prevention of static electricity, a smaller semiconductor light emitting device can be provided at a lower cost.

The thickness of each of the n-side metal pillar 24 and the p-side metal pillar 23 (thicknesses in the vertical direction in FIG. 1) is thicker than the thickness of a stacked body including the semiconductor layer 15, the n-side electrode 17, the p-side electrode 16, the insulating layer 18, the n-side interconnection layer 22 and the p-side interconnection layer 21. The aspect ratio (ratio of thickness to horizontal size) of each of the metal pillars 23 and 24 is not limited to 1 or more, and may be lower than 1. In other words, the thickness of each of the metal pillars 23 and 24 may be smaller than the horizontal size thereof.

According to the structure of this embodiment, even with a thin semiconductor layer 15, mechanical strength can be maintained by forming the n-side metal pillar 24, the p-side metal pillar 23 and the resin layer 25 thickly. In addition, when the semiconductor light emitting device is mounted on the mount board 81, a stress applied to the semiconductor layer 15 via the solder 51 is absorbed by the n-side metal pillar 24 and the p-side metal pillar 23 and is thus eased. Note that the external terminals for connecting the semiconductor light emitting device and the mount board 81 is not limited to the solder, and may be other metals.

Next, a method for manufacturing the semiconductor light emitting device of this embodiment is described with reference to FIGS. 3A to 14.

Firstly, the first semiconductor layer 11 is formed on a main surface of a substrate 10, and the second semiconductor layer 13 including the light emitting layer 12 is formed thereon. In a case where the semiconductor layer 15 (the first semiconductor layer 11 and the second semiconductor layer 13) is nitride-based semiconductor, for example, the semiconductor layer 15 may be crystal grown on a sapphire substrate, for example.

Next, a separating groove 14 is formed as shown in FIG. 3A and FIG. 3B which is a bottom view of FIG. 3A by a reactive ion etching (RIE) method, for example, using an unillustrated resist. The separating groove 14 is formed to penetrate the semiconductor layer 15 to reach the substrate 10. The separating groove 14 is formed in a lattice pattern, for example, on the substrate 10, and segments the semiconductor layer 15 into multiple pieces.

In addition, a part of the second semiconductor layer 13 including the light emitting layer 12 is removed by the RIE method, for example, using an unillustrated resist, so that a part of the first semiconductor layer 11 is exposed. Thus, the upper part positioned in an upper part as seen from the substrate 10, and the lower part positioned in a lower part closer to the substrate 10 than the upper part are formed on the second main surface side of the semiconductor layer 15. The upper part includes the light emitting layer 12 and the lower part does not include the light emitting layer 12.

Then, the p-side electrode 16 is formed on a surface of the upper part (a surface of the second semiconductor layer 13), and the n-side electrode 17 is formed on a surface of the lower part (a surface of the first semiconductor layer 11). Any one of the p-side electrode 16 and the n-side electrode 17 may be formed first, or otherwise, the p-side electrode 16 and the n-side electrode 17 may be formed simultaneously with the same material.

Figure 4A:
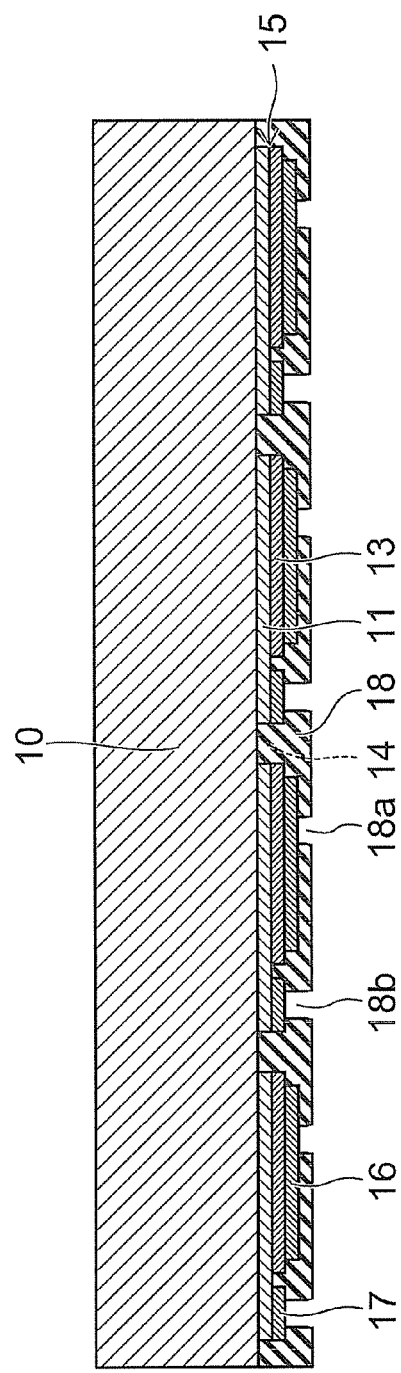

Then, after covering all of exposed parts of the substrate 10 with the insulating layer 18, the insulating layer 18 is patterned as shown in FIG. 4A by wet etching, for example, to selectively form the first openings 18a and the second openings 18b in the insulating layer 18. The first openings 18a reach the p-side electrodes 16, whereas the second openings 18b reach the n-side electrodes 17. The insulating layer 18 is filled in the separating groove 14.

Figure 4B:
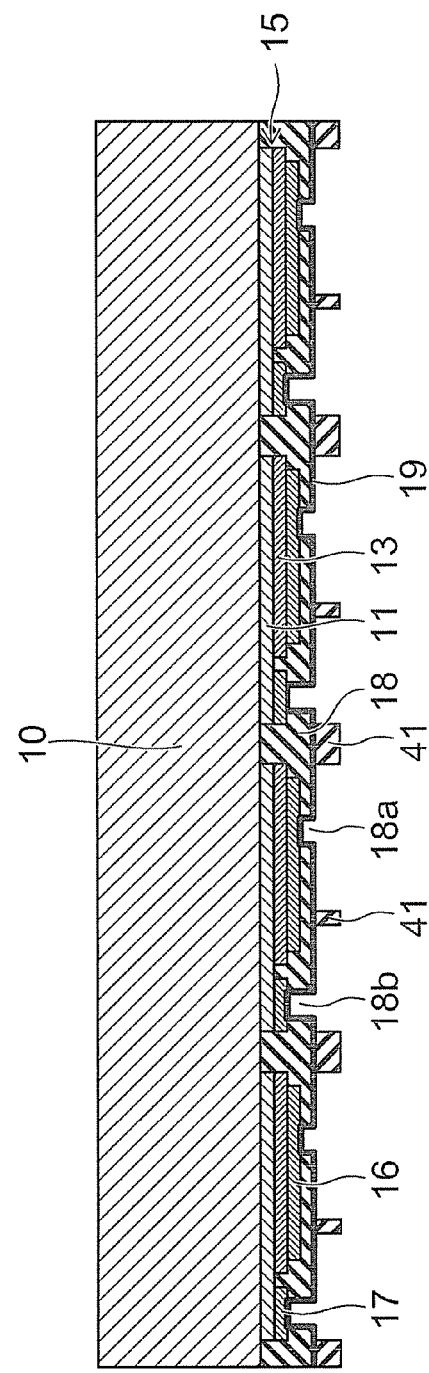

Next, as shown in FIG. 4B, a continuous seed metal 19 is formed on a surface of the insulating layer 18 and on inside surfaces of the first openings 18a and the second openings 18b. In addition, resists 41 are selectively formed on the seed metal 19 and copper electroplating is performed by using the seed metal 19 as a current path.

Figure 5A:
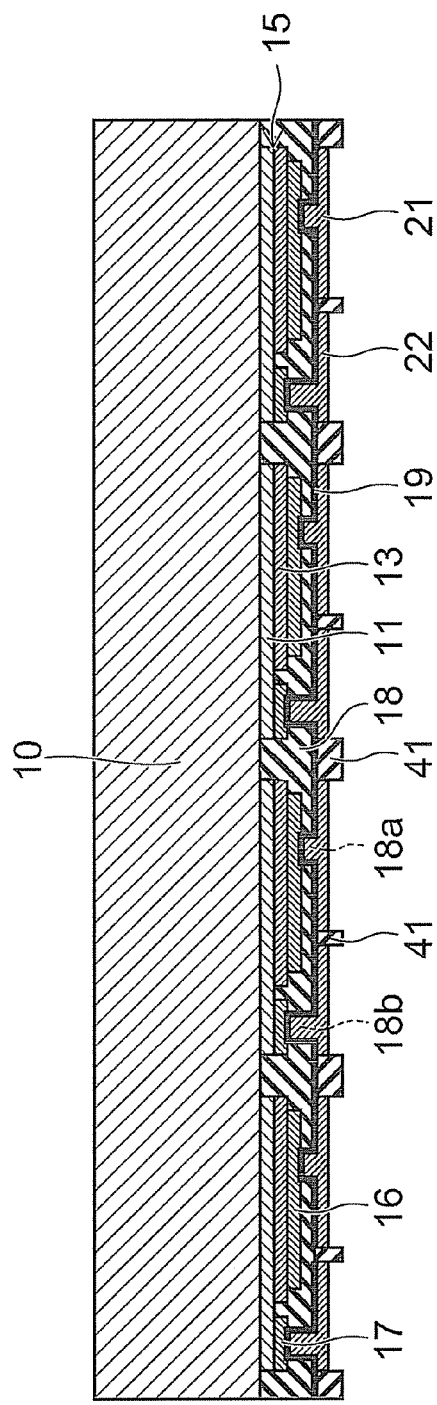
Figure 5B:
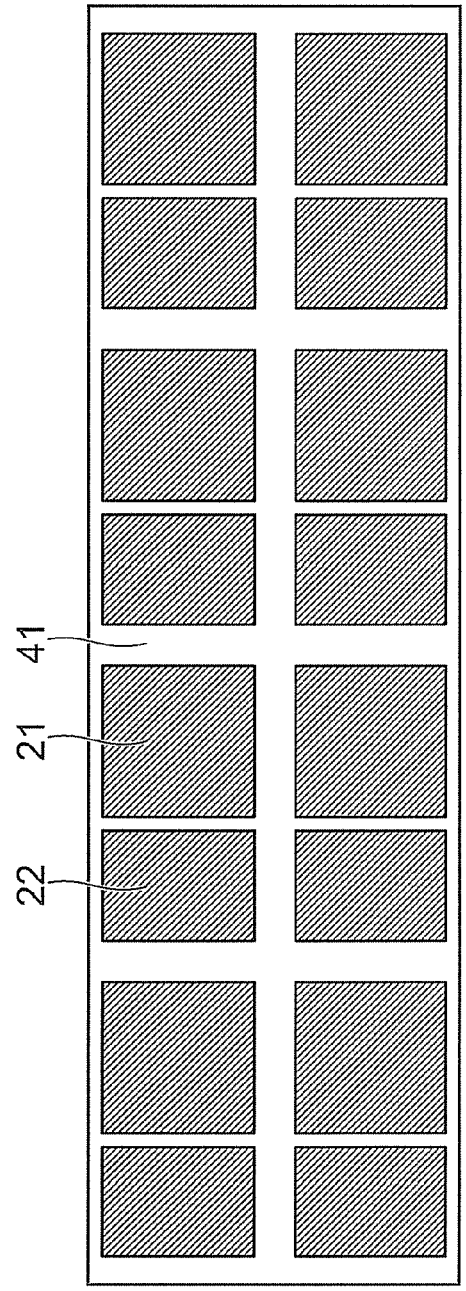

Thus, as shown in FIG. 5A and FIG. 5B which is a bottom view of FIG. 5A, the p-side interconnection layer 21 and the n-side interconnection layer 22 are selectively formed on the seed metal 19. The p-side interconnection layer 21 and the n-side interconnection layer 22 are made of a copper material simultaneously formed by plating. The p-side interconnection layer 21 is also formed inside the first openings 18a, and is connected to the p-side electrodes 16 via the seed metal 19. The n-side interconnection layer 22 is also formed inside the second openings 18b, and is connected to the n-side electrodes 17 via the seed metal 19.

The resists 41 used for plating the p-side interconnection layer 21 and the n-side interconnection layer 22 are removed by a chemical, for example (FIG. 6A). Thereafter, as shown in FIG. 6B, other resists 42 for forming metal pillars are formed, and copper electroplating is performed by using the seed metal 19 as a current path. The resist 42 is thicker than the resist 41.

Figures 7A, 7B:
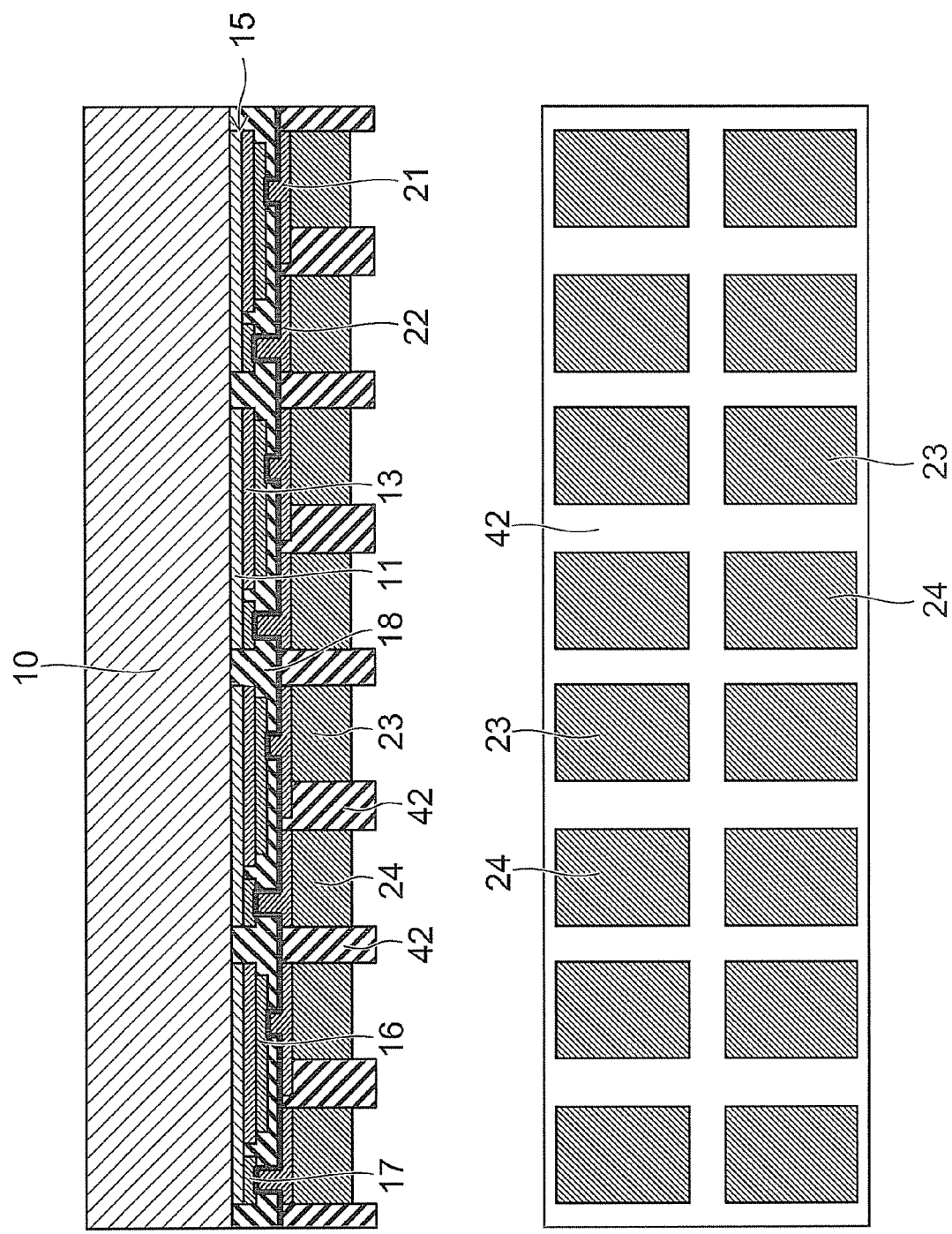

Thus, as shown in FIG. 7A and FIG. 7B which is a bottom view of FIG. 7A, the p-side metal pillars 23 are formed on the p-side interconnection layer 21, and the n-side metal pillars 24 are formed on the n-side interconnection layer 22. The p-side metal pillars 23 and the n-side metal pillars 24 are made of a copper material simultaneously formed by plating.

The resists 42 are removed by a chemical, for example (FIG. 8A). Thereafter, exposed parts of the seed metal 19 are wet etched by using the p-side metal pillars 23 and the n-side metal pillars 24 as a mask (FIG. 8B). Thus, electrical connection between the p-side interconnection layer 21 and the n-side interconnection layer 22 via the seed metal 19 is cut off.

Next, as shown in FIG. 9A, the resin layer 25 is stacked on the insulating layer 18. The resin layer 25 is filled between the p-side interconnection layer 21 and the n-side interconnection layer 22, as well as between the p-side metal pillar 23 and the n-side metal pillar 24. Side surfaces of each of the p-side metal pillar 23 and the n-side metal pillar 24 are covered with a resin layer 25.

Then, as shown in FIG. 9B, the substrate 10 is removed. The substrate 10 is removed by a laser lift-off process, for example. To be specific, the first semiconductor layer 11 is irradiated with a laser beam from the back surface side of the substrate 10. The laser beam has a wavelength to transmit the substrate 10, and to be absorbed by the first semiconductor layer 11.

When the laser beam reaches an interface between the substrate 10 and the first semiconductor layer 11, the first semiconductor layer 11 near the interface absorbs energy of the laser beam and is decomposed. For example, in a case where the first semiconductor layer 11 is GaN, the first semiconductor layer 11 is decomposed into Ga and nitrogen gas. This decomposition reaction causes a small gap between the substrate 10 and the first semiconductor layer 11, and thus the substrate 10 and the first semiconductor layer 11 are separated.

The substrate 10 is removed by radiating the laser beam on the entire wafer, the laser beam being radiated multiple times on predetermined regions. Light extraction efficiency can be enhanced by removing the substrate 10 from the first main surface 15a.

Here, the layer made of the resin and the metal is flexible, and the metal is formed by plating at near room temperature. Hence, the residual stress occurring with respect to the translucent substrate 10 is relatively low.

In the conventional technique for separating the semiconductor layer from the translucent substrate at wafer level, for example, it is bonded to a silicon substrate with a metal layer formed thereon using Au—Sn solder at a high temperature of 300° C. or more, and then the semiconductor layer made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle semiconductor layer.

In contrast, in this embodiment, the residual stress is low, and the semiconductor layer 15 is separated in the state of being fixed to a flexible support. Hence, the device can be manufactured at high yield without trouble such as cracking in the semiconductor layer 15.

The surface from which the substrate 10 is removed is cleaned, and is roughened by a frosting process. Light extraction efficiency can be enhanced by roughening the first main surface 15a.

Figure 10A:
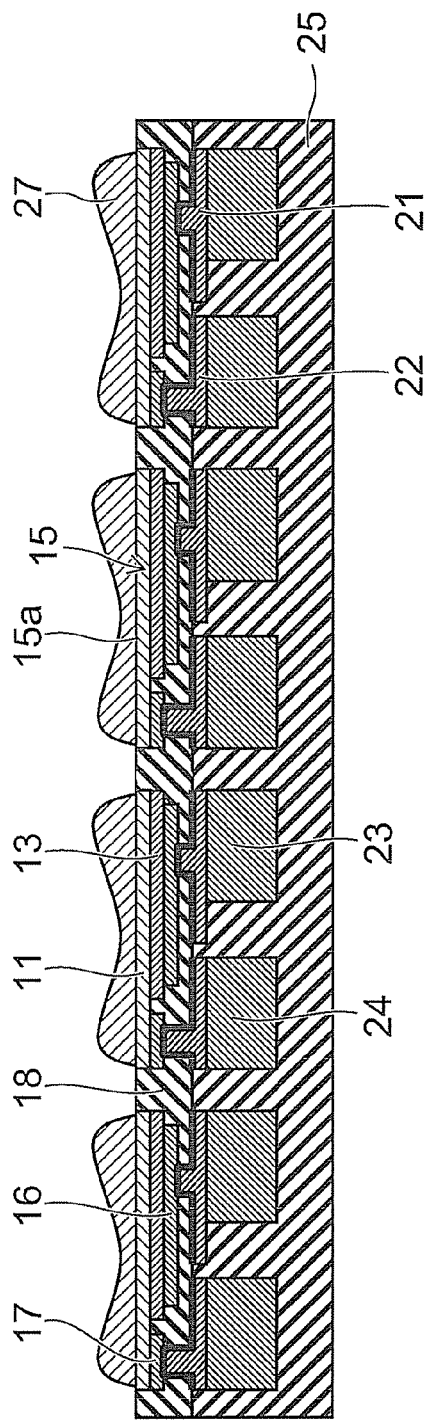
Figure 10B:
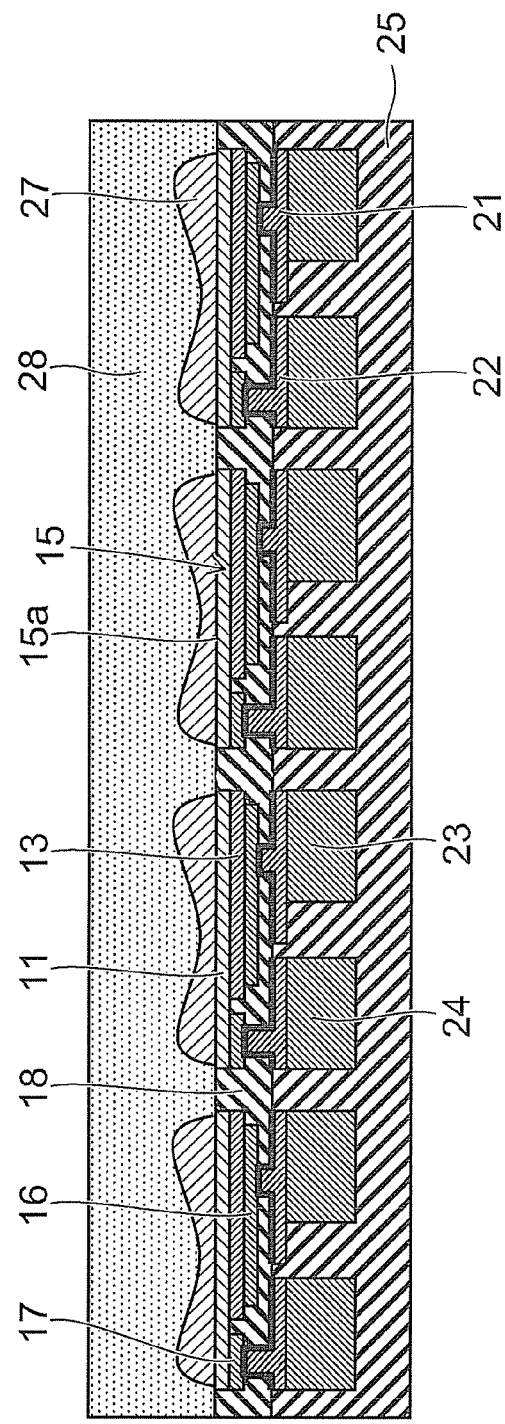

Thereafter, as shown in FIG. 10A, the lenses 27 are formed on the first main surface 15a, and the phosphor layer 28 is formed on the lenses 27 as shown in FIG. 10B. For example, transparent liquid resin in which phosphor grains are dispersed is applied by spin coating and then heat-cured to form the phosphor layer 28.

Figure 11A:
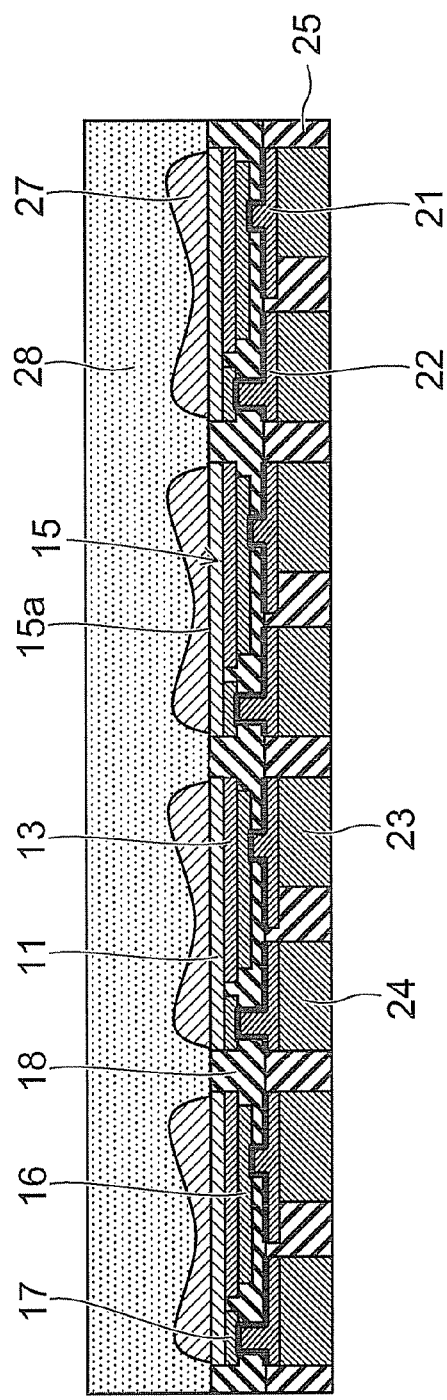
Figure 11B:
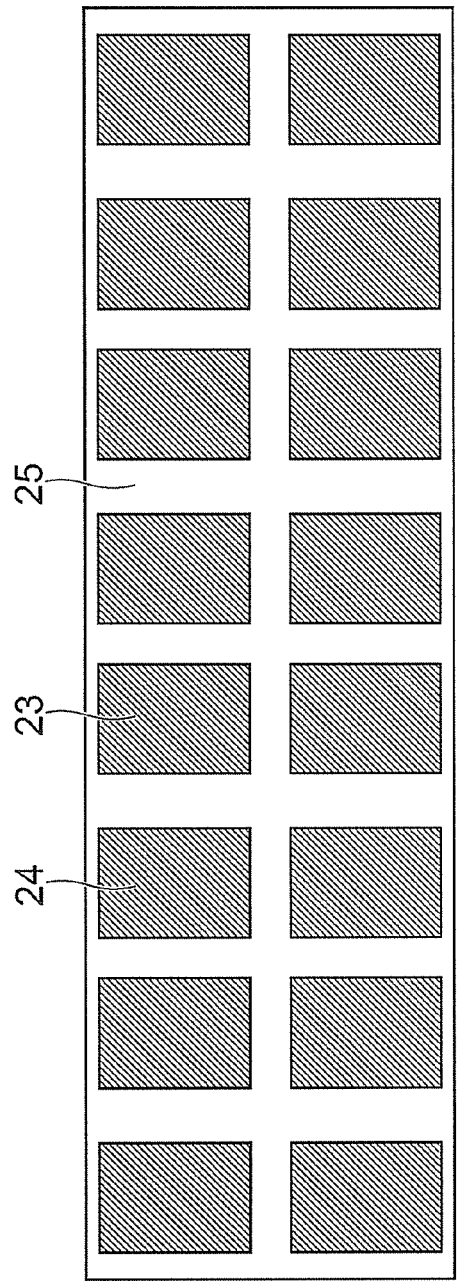
Figure 12A:
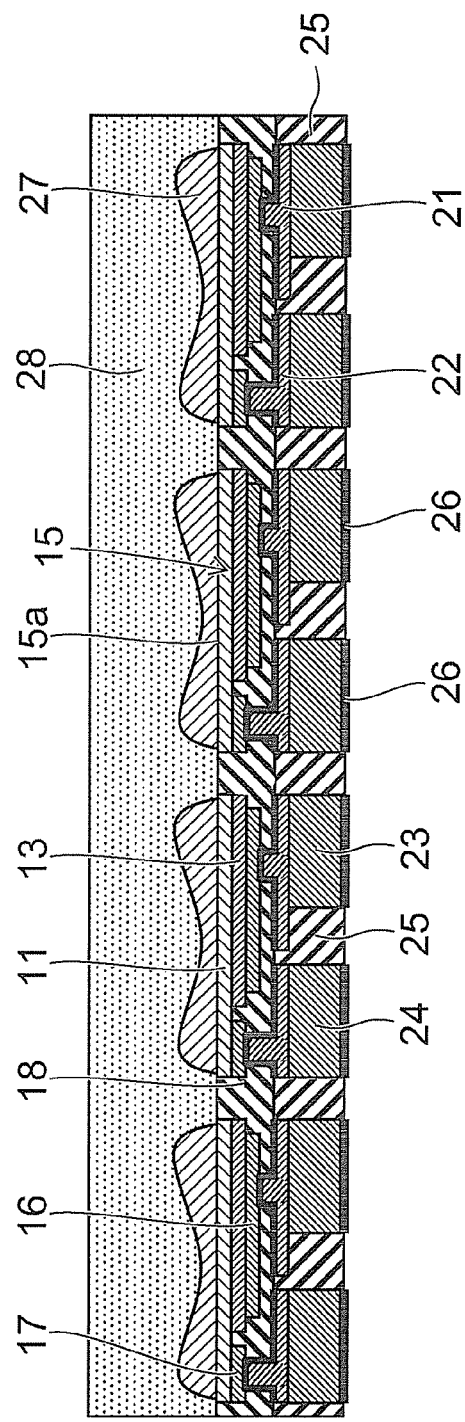
Figure 12B:
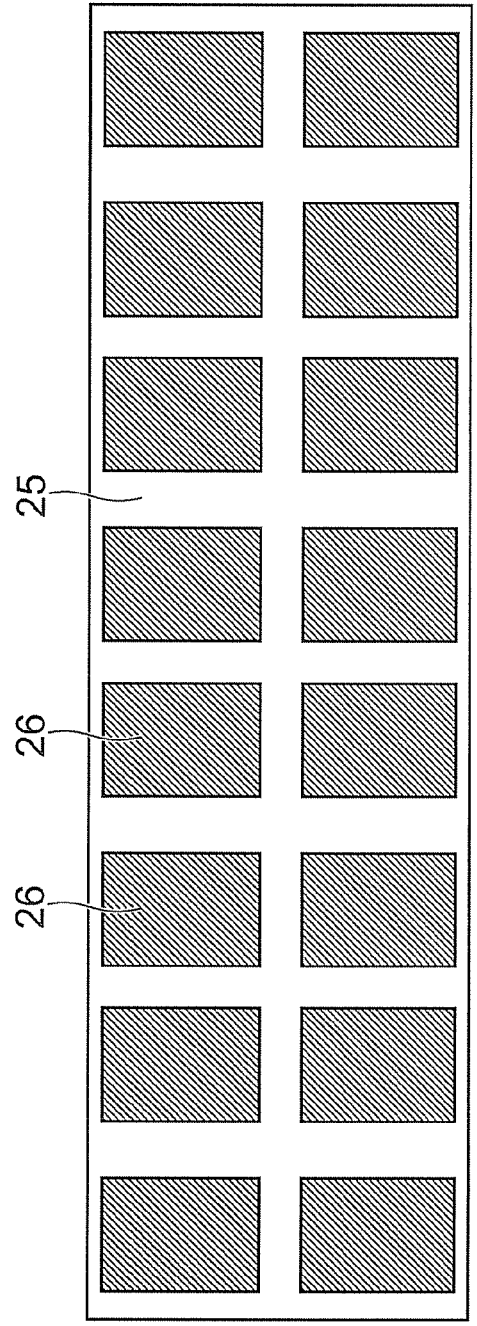

Then, the back surface of the resin layer 25 is ground, and bottom surfaces of the p-side metal pillars 23 and the n-side metal pillars 24 are exposed as shown in FIG. 11A and FIG. 11B which is a bottom view of FIG. 11A. Thereafter, as shown in FIG. 12A and FIG. 12B which is a bottom view of FIG. 12A, the top coat film 26 is formed on bottom surfaces of the p-side metal pillars 23 and the n-side metal pillars 24.

Then, the wafer is diced along the separating groove 14 (FIGS. 3A and 3B) into multiple semiconductor light emitting devices (FIGS. 13A and 13B). The substrate 10 is already removed at the dicing. Moreover, the semiconductor layer 15 is not provided in the separating groove 14 and resin may be filled therein as the insulating layer 18. In this way, the wafer is more easily diced and productivity can be improved. In addition, the semiconductor layer 15 can be prevented from being damaged at the dicing. After the cut-out of the individual devices, a configuration is obtained in which ends (side surfaces) of the semiconductor layer 15 are covered with resin and protected.

The cut-out semiconductor light emitting device may have a single-chip structure including a single semiconductor layer 15, or may have a multi-chip structure including multiple semiconductor layers 15.

Since the aforementioned processes before dicing are collectively performed on a wafer, interconnection and packaging need not be carried out for individual devices obtained by the cut-out, whereby manufacturing cost can be reduced significantly. That is, the device is already interconnected and packaged after being cut out into the individual devices. In addition, the planar size of each device can be easily reduced to approximately the planar size of a bare chip (semiconductor layer 15). Moreover, test can be carried out by wafers, leading to improvement in productivity and making it easier to manufacture the devices at a lower cost.

Figure 14:
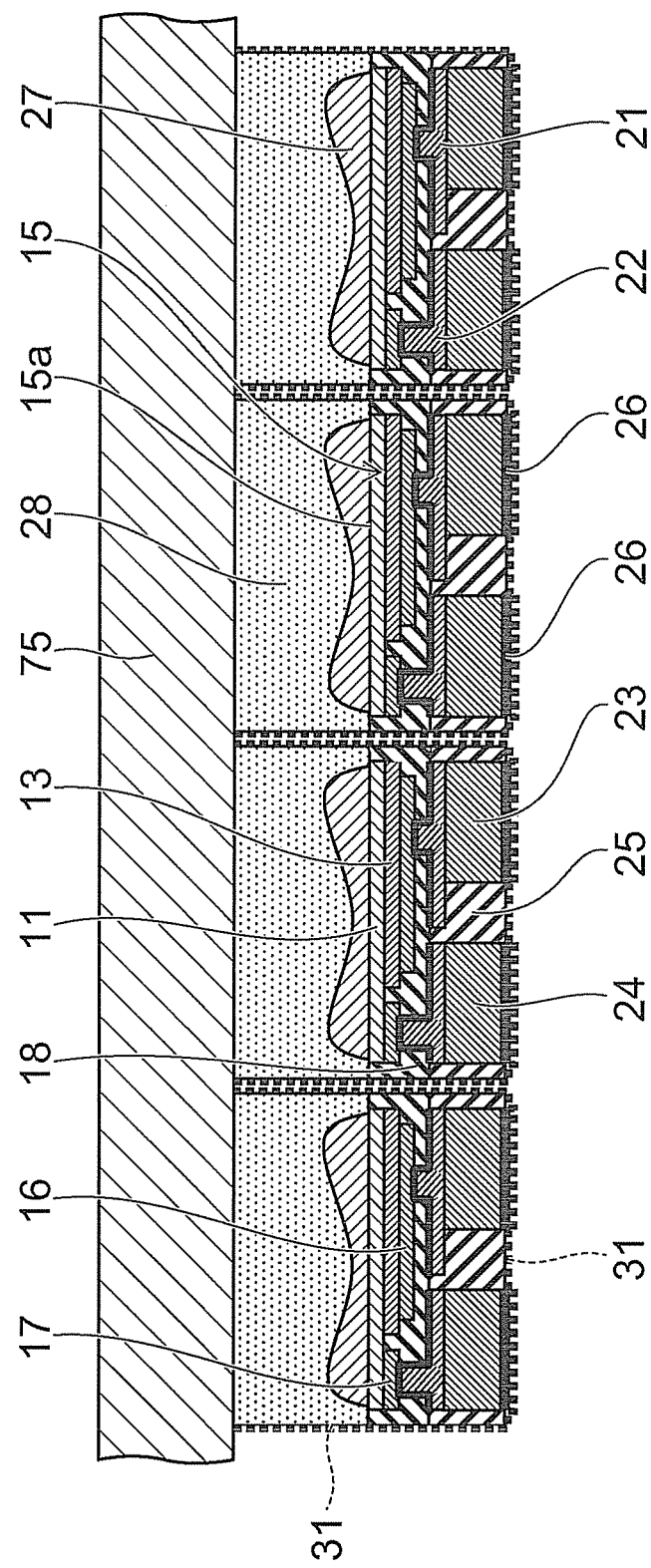

As shown in FIG. 14, the devices are cut out with a tape (or a sheet) 75 attached on the phosphor layer 28 side. Then, after the devices are cut out, a polythiophene solution may be supplied as a conducting polymer to the entire exposed surface (mounting surface opposite to tape 75 and side surfaces) by spin coating or the like. Otherwise, a solvent-diluted polypyrrole solution may be used.

Then, by drying the above solution, the conducting polymer film 31 is formed on the mounting surface and side surfaces of each cut-out semiconductor light emitting device. The conducting polymer film 31 short-circuits the p-side bonding surface and the n-side bonding surface on the mounting surface. With this configuration, the semiconductor light emitting device can be protected from ESD until the device is mounted on the mount board.

(Second Embodiment)

Next, a second embodiment is described with reference to FIGS. 15 and 16.

Figure 15:
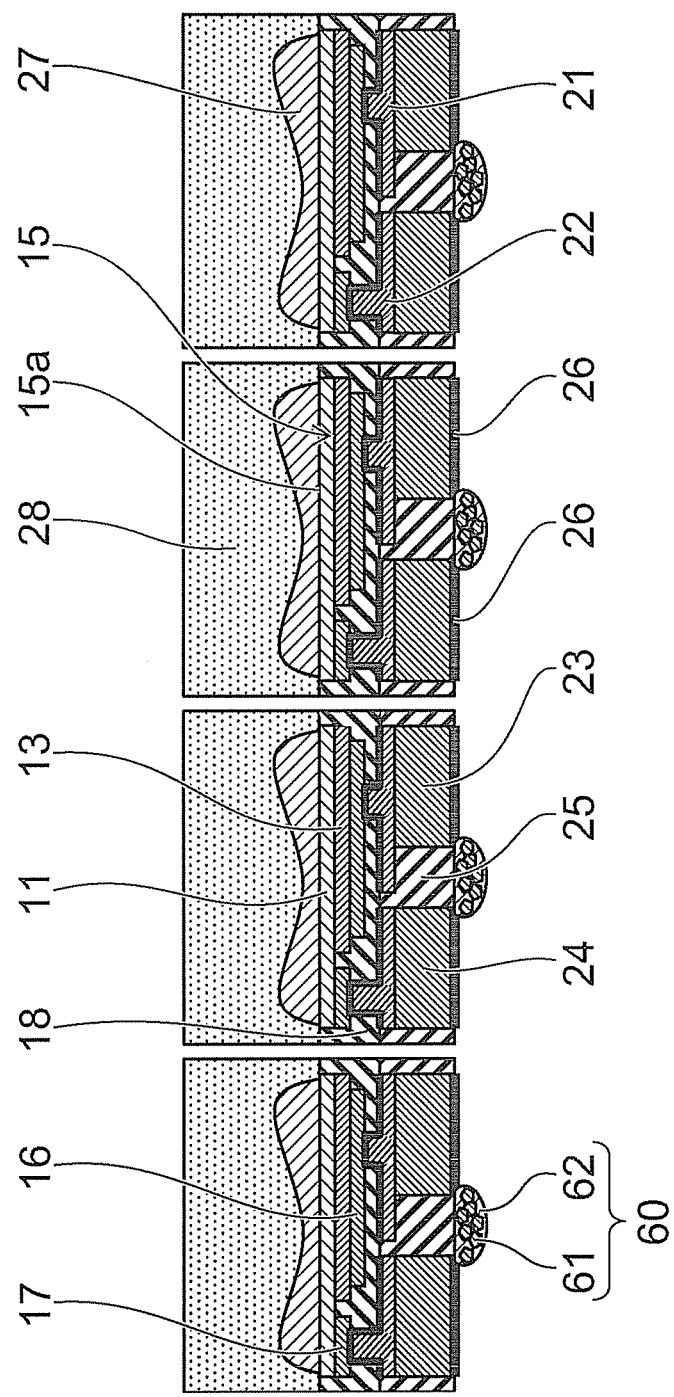
FIG. 15 is a schematic view showing a method for manufacturing a semiconductor light emitting device of a second embodiment.
Figure 16:
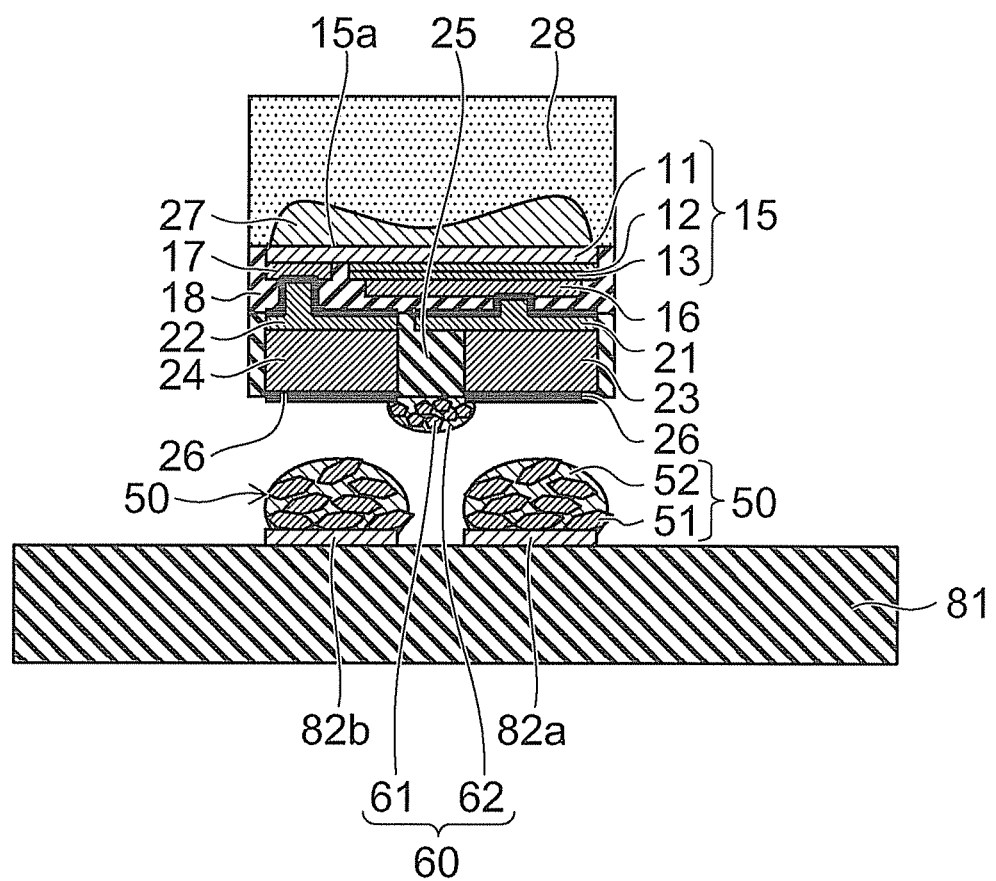
FIG. 16 is a schematic cross-sectional view of the semiconductor light emitting device of the second embodiment.

In this embodiment as shown in FIG. 15, after a semiconductor light emitting device is cut out, a conductive paste 60 is formed as a conductive material on a surface of a resin layer 25 between a p-side metal pillar 23 and an n-side metal pillar 24. The conductive paste 60 is also formed on a part of a top coat film 26 formed on the bottom surface of the p-side metal pillar 23 and a part of the top coat film 26 formed on the bottom surface of the n-side metal pillar 24. With this configuration, the p-side metal pillar 23 and the n-side metal pillar 24 are short-circuited via the conductive paste 60. Accordingly, as similar to the first embodiment, the semiconductor light emitting device of this embodiment includes a leak path for an ESD surge formed on a surface of the device, so that the ESD surge does not flow inside the device. Thus, the semiconductor light emitting device can be prevented from being broken by ESD.

The conductive paste 60 contains a metal powder 61 and a binder 62. The metal powder 61 is preferably a metal which has lower solderability than the p-side metal pillar 23, the n-side metal pillar 24 or the top coat film 26, which is not wetted by solder and which does not rust. Examples of such a metal powder 61 include aluminum, nickel and stainless steel (SUS). The binder 62 is preferably a polymer such as polyvinyl alcohol (PVA), soluble to water or to an organic solvent.

The conductive paste 60 is locally supplied by potting, for example, between bonding surfaces having different polarities, so that parts of the bonding surfaces are exposed. In this state, the semiconductor light emitting device is mounted on a mount board 81 with a solder paste 50 interposed therebetween as shown in FIG. 16, and reflow soldering is carried out. Thus, the solder 51 is melted and the semiconductor light emitting device and the pads 82a, 82b are bonded with the solder 51. Since the metal powder 61 in the conductive paste 60 is not wetted by the solder 51, the solder 51 is not bonded with the metal powder 61 to form a bridge at the bonding.

In addition, by using, for the conductive paste 60, a binder 62 having a melting point lower than the reflow temperature or a binder 62 that dissolves with the flux 52 of the solder paste 50, the surface tension of the melted solder 51 may push aside the conductive paste 60. Accordingly, the solder 51 can be surely bonded to the exposed parts of the bonding surface.

As in the first embodiment, after mounting, cleaning is carried out in this embodiment by use of water or an organic solvent to remove the flux 52. The conductive paste 60 is also cleaned and removed at this time. Thus, after the mounting and cleaning, the leak path that short-circuits the p-side metal pillar 23 and the n-side metal pillar 24 is eliminated.

If a protection device such as a zener diode is mounted on the mount board 81 together with the semiconductor light emitting device in the aforementioned embodiments, the mounted semiconductor light emitting device can be protected from ESD.

Figure 18:
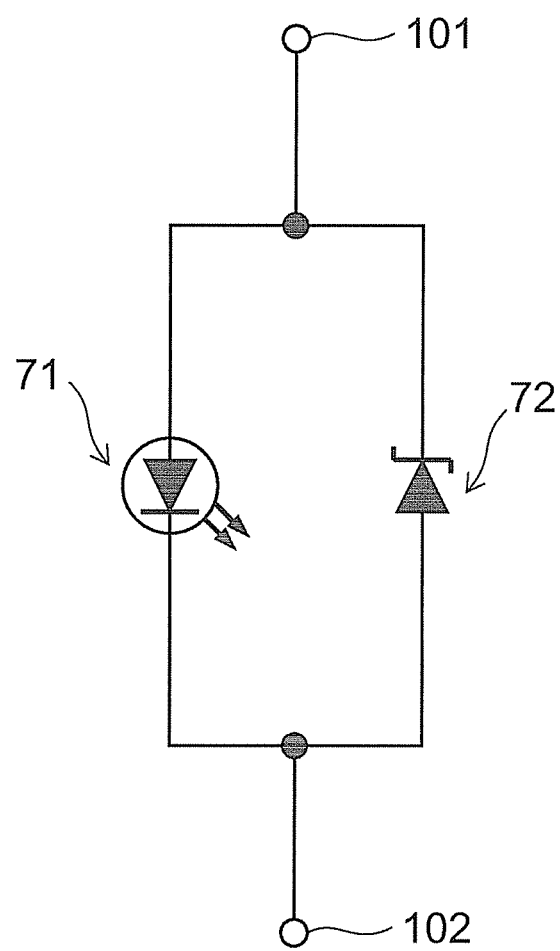
FIG. 18 is an equivalent circuit diagram of the semiconductor light emitting device of the embodiment and an ESD protection element mounted on the mount board.

FIG. 18 shows an equivalent circuit diagram of a configuration in which a semiconductor light emitting device 71 of the aforementioned embodiment and a protection device such as a zener diode 72 are mounted on the mount board 81.

The semiconductor light emitting device 71 and the zener diode 72 are connected in parallel between a terminal 101 and a terminal 102. An anode (p side) of the semiconductor light emitting device 71 and a cathode of the zener diode 72 are connected to the terminal 101, and a cathode (n side) of the semiconductor light emitting device 71 and an anode of the zener diode 72 are connected to the terminal 102.

In particular, gallium nitride based semiconductor light emitting devices tend to be less capable of withstanding reverse bias than forward bias. However, by adopting the configuration shown in FIG. 18, a negative ESD surge applied to the semiconductor light emitting device 71 is discharged through the zener diode 72, and thus the semiconductor light emitting device 71 is protected from the ESD surge.

It suffices that the minimum necessary number of protection elements are mounted on the mount board 81, and not necessarily the same number of protection elements as the semiconductor light emitting devices are required. Costs can be reduced by providing a common protection element for multiple semiconductor light emitting devices.

In the embodiments described above, instead of being removed entirely, the substrate 10 may be ground thinly and be left on the first main surface 15a. By leaving the substrate 10 in the form of a thin layer, mechanical strength can be made stronger than the configuration in which the substrate 10 is removed entirely, and thus a highly reliable configuration can be obtained. In addition, by leaving the substrate 10, warpage of the light emitting device after being cut out can be prevented, making it easier to mount the device to a mount board or the like.

Alternatively, as shown in FIG. 17A, the phosphor layer 28 may be formed on the first main surface 15a, and then lenses 51 may be provided on the phosphor layer 28. Although the concave lens 27 has been shown as an example in the above embodiment, the convex lens 51 as shown in FIG. 17A may be used instead.

Alternatively, as shown in FIG. 17B, the lenses 51 may be provided on the first main surface 15a, and then the phosphor layer 28 may be formed to cover the lenses 51.

The red phosphor layer may contain a nitride based phosphor $CaAlSiN_3$:Eu or a SiAlON based phosphor, for example.

When using a SiAlON based phosphor, it may be preferable to use the following material.

$(M_{1-x}R_x)_{a1}AlSi_{b1}O_{c1}N_{d1}$    composition formula 1

(M is at least one metallic element except for Si or Al, and desirably at least one of Ca and Sr. R is a luminescent center element and Eu is desirable. x, a1, b1, c1 and d1 satisfy the following relationship: $0<x\leq1$, $0.6<a1<0.95$, $2<b1<3.9$, $0.25<c1<0.45$, $4<d1<5.7$).

By using the SiAlON based phosphor expressed by the composition formula 1, temperature property of wavelength conversion efficiency is improved, and efficiency in regions of high current density can be further improved.

The yellow phosphor layer may contain a silicate based phosphor $(Sr, Ca, Ba)_2SiO_4$:Eu, for example.

The green phosphor layer may contain a halophosphate phosphor $(Ba, Ca, Mg)_{10}(PO_4)_6.Cl_2$:Eu or a SiAlON based phosphor.

When using a SiAlON based phosphor, it may be preferable to use the following material.

$(M_{1-x}R_x)_{a2}AlSi_{b2}O_{c2}N_{d2}$    composition formula 2

(M is at least one metallic element except for Si or Al, and desirably at least one of Ca and Sr. R is a luminescent center element and Eu is desirable. x, a2, b2, c2 and d2 satisfy the following relationship: $0<x\leq1$, $0.93<a2<1.3$, $4.0<b2<5.8$, $0.6<c2<1$, $6<d2<11$).

By using the SiAlON based phosphor expressed by the composition formula 2, temperature property of wavelength conversion efficiency is improved, and efficiency in regions of high current density can be further improved.

The blue phosphor layer may contain an oxide based phosphor $BaMgAl_{10}O_{17}$:Eu, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:
1. A protection structure for formation of a semiconductor light emitting device comprising:

a semiconductor layer having a first main surface, a second main surface opposite side to the first main surface, and a light emitting layer;

a first electrode provided on the second main surface in a region where the light emitting layer is provided;

a second electrode provided on the second main surface;

an insulating layer provided on the second main surface side of the semiconductor layer and including a first opening that reaches the first electrode and a second opening that reaches the second electrode;

a first interconnection layer provided on a surface of the insulating layer opposite to a surface facing the semiconductor layer and provided in the first opening, the first interconnection layer being connected to the first electrode;

a second interconnection layer provided on a surface of the insulating layer opposite to a surface facing the semiconductor layer and provided in the second opening, the second interconnection layer being connected to the second electrode;

a first metal pillar provided on a surface of the first interconnection layer opposite to a surface facing the first electrode;

a second metal pillar provided on a surface of the second interconnection layer opposite to a surface facing the second electrode;

a resin layer provided between a side surface of the first metal pillar and a side surface of the second metal pillar; and a conducting polymer film provided on a surface of the resin layer between the first metal pillar and the second metal pillar, the conducting polymer film electrically connecting the first metal pillar and the second metal pillar, and shorting the first metal pillar and the second metal pillar, the conducting polymer film provided on side surfaces of the insulating layer and the resin layer, the side surfaces being not parallel to the first main surface.

2. The protection structure for formation of the semiconductor light emitting device of claim 1, wherein the conducting polymer film is soluble to one of water and an organic solvent.

3. The protection structure for formation of the semiconductor light emitting device of claim 1, wherein the conducting polymer film is provided on a surface of the resin layer which is opposite to a surface facing the semiconductor layer, a surface of the first metal pillar and a surface of the second metal pillar.

4. The protection structure for formation of the semiconductor light emitting device of claim 1, wherein each of thicknesses of the first metal pillar and the second metal pillar is thicker than a thickness of a stacked body including the semiconductor layer, the first electrode, the second electrode, the insulating layer, the first interconnection layer and the second interconnection layer.

5. The protection structure for formation of the semiconductor light emitting device of claim 1, wherein an area of the first electrode is larger than an area of the second electrode.

6. The protection structure for formation of the semiconductor light emitting device of claim 1, wherein a contact area between the second interconnection layer and the second metal pillar is larger than a contact area between the second interconnection layer and the second electrode.

7. The protection structure for formation of the semiconductor light emitting device of claim 1, wherein a part of the second interconnection layer is extended on the insulating layer to a position facing the light emitting layer.

8. The protection structure for formation of the semiconductor light emitting device of claim 1, further comprising a phosphor layer provided on the first main surface, and
wherein the insulating layer surrounds a periphery of the semiconductor layer, and the resin layer supports the semiconductor layer with the first metal pillar and the second metal pillar.

9. The protection structure for formation of the semiconductor light emitting device of claim 1, wherein a leak path for an ESD surge is formed between the first metal pillar and the second metal pillar via the conducting polymer film.

10. The protection structure for formation of the semiconductor light emitting device of claim 1, further comprising a phosphor layer provided on the first main surface side without a substrate between the first main surface and the phosphor layer.

* * * * *